(12) United States Patent
Sarkis et al.

(10) Patent No.: US 11,368,248 B2
(45) Date of Patent: *Jun. 21, 2022

(54) METHODS AND APPARATUS FOR DETERMINING TRANSPORT BLOCK SIZE IN WIRELESS COMMUNICATION

(71) Applicant: QUALCOMM Incorporated, San Diego, CA (US)

(72) Inventors: Gabi Sarkis, San Diego, CA (US); Joseph Binamira Soriaga, San Diego, CA (US); Jing Sun, San Diego, CA (US); Jing Jiang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/877,398

(22) Filed: May 18, 2020

(65) Prior Publication Data

US 2020/0280394 A1 Sep. 3, 2020

Related U.S. Application Data

(63) Continuation of application No. 16/192,697, filed on Nov. 15, 2018, now Pat. No. 10,680,751.
(Continued)

(51) Int. Cl.
*H04L 1/00* (2006.01)
*H03M 13/11* (2006.01)
(Continued)

(52) U.S. Cl.
CPC .......... *H04L 1/0058* (2013.01); *H03M 13/09* (2013.01); *H03M 13/116* (2013.01);
(Continued)

(58) Field of Classification Search
CPC ... H04L 1/0058; H04L 1/0009; H04L 1/0041; H04L 1/0061; H04L 27/26; H04L 5/0023;
(Continued)

(56) References Cited

U.S. PATENT DOCUMENTS 10,680,751 B2 * 6/2020 Sarkis .................. H04B 7/0473
2015/0103760 A1 4/2015 Zhang et al.
(Continued)

FOREIGN PATENT DOCUMENTS

CN 101821980 A 9/2010
CN 101911641 A 12/2010
(Continued)

OTHER PUBLICATIONS

CATT: "NR TB Size Determination," 3GPP Draft; R1-1712412, 3rd Generation Partnership Project (3GPP), Mobile Competence Centre; 650, Route Des Lucioles; F-06921 Sophia-Antipolis Cedex; France vol. RAN WG1, No. Prague, Czechia; Aug. 21, 2011-May 25, 2017 Aug. 20, 2017 (Aug. 20, 2017), XP051315228, 2 pages, Retrieved from the Internet: URL:http://www.3gpp.org/ftp/Meetings_3GPP_SYNC/RAN1/Docs/ [retrieved on Aug. 20, 2017].
(Continued)

*Primary Examiner* — Michael R Neff
(74) *Attorney, Agent, or Firm* — Loza & Loza LLP

(57) ABSTRACT

Apparatuses and methods are disclosed for determining a transport block size (TBS) as a function of various parameters without cyclic dependencies between the parameters and TBS. The disclosed function can determine a TBS in a single pass, and the determined TBS allows the use of code blocks with equal code block size (CBS) in a transport block segmentation process. The determined TBS can provide byte-aligned code block lengths and require no padding bits in a transport block.

18 Claims, 10 Drawing Sheets

Related U.S. Application Data

(60) Provisional application No. 62/588,137, filed on Nov. 17, 2017.

(51) Int. Cl.

| | | |
|---|---|---|
| *H03M 13/00* | (2006.01) | |
| *H04L 27/26* | (2006.01) | |
| *H03M 13/09* | (2006.01) | |
| *H04B 7/0456* | (2017.01) | |
| *H04W 28/06* | (2009.01) | |
| H04L 5/00 | (2006.01) | |
| H04L 5/14 | (2006.01) | |

(52) U.S. Cl.
CPC ...... *H03M 13/6516* (2013.01); *H04B 7/0473* (2013.01); *H04L 1/0009* (2013.01); *H04L 1/0041* (2013.01); *H04L 1/0061* (2013.01); *H04L 27/26* (2013.01); *H04W 28/06* (2013.01); *H04L 5/0023* (2013.01); *H04L 5/0044* (2013.01); *H04L 5/0053* (2013.01); *H04L 5/14* (2013.01)

(58) Field of Classification Search
CPC ....... H04L 5/0044; H04L 5/0053; H04L 5/14; H03M 13/09; H03M 13/116; H03M 13/6516; H04B 7/0473; H04W 28/06
USPC .......................................................... 375/262
See application file for complete search history.

(56) References Cited

U.S. PATENT DOCUMENTS

| | | | |
|---|---|---|---|
| 2017/0099327 A1 | 4/2017 | Negalaguli et al. | |
| 2019/0158221 A1 | 5/2019 | Sarkis et al. | |

FOREIGN PATENT DOCUMENTS

| | | | |
|---|---|---|---|
| EP | 2086143 | A2 | 8/2009 |
| EP | 3200369 | A1 | 8/2017 |

OTHER PUBLICATIONS

CATT: "PDSCH and PUSCH Resource Allocation," 3GPP Draft; R1-1717833, 3rd Generation Partnership Project (3GPP), Mobile Competence Centre; 650, Route Des Lucioles; F-06921 Sophia-Antipolis Cedex; France vol. RAN WG1, No. Prague, CZ; Oct. 9, 2017-Oct. 13, 2017 Oct. 8, 2017 (Oct. 8, 2017), XP051341018, 9 pages, Retrieved from the Internet: URL:http://www.3gpp.org/ftp/Meetings_3GPP_SYNC/RAN1/Docs/ [retrieved on Oct. 8, 2017].
International Search Report and Written Opinion—PCT/US2018/061676—ISA/EPO dated Feb. 28, 2019.
Mediatek Inc: "TB Size Determination and Channel Coding Considerations," 3GPP Draft; R1-1718353_TB Size Determination and Channel Coding Considerations, 3rd Generation Partnership Project (3GPP), Mobile Competence Centre; 650, Route Des Lucioles; F-06921 Sophia-Antipolis, vol. RAN WG1, No. Prague, Czechia; Oct. 9, 2017-Oct. 13, 2017 Oct. 8, 2017 (Oct. 8, 2017), XP051341536, 8 pages, Retrieved from the Internet: URL:http://www.3gpp.org/ftp/Meetings_3GPP_SYNC/RAN1/Docs/ [retrieved on Oct. 8, 2011].
Qualcomm Incorporated: "TBS and Base-Graph Determination," 3GPP Draft; R1-1720699-TBS and Base-Graph Determination, 3rd Generation Partnership Project (3GPP), Mobile Competence Centre; 650, Route Des Lucioles; F-06921 Sophia-Antipolis Cedex; France, vol. RAN WG1, No. Reno, USA; Nov. 27, 2017-Dec. 1, 2017 Nov. 18, 2017 (Nov. 18, 2017), XP051370160, pp. 1-10, Retrieved from the Internet: URL:http://www.3gpp.org/ftp/tsg%5Fran/WG1%5FRL1/TSGR1%5F91/Docs/ [retrieved on Nov. 18, 2017].
Ericsson: "Code Block Segmentation for NR Data Channel", R1-1715735, 3GPP TSG RAN WG1 #AH, 3GPP (Sep. 12, 2017), 7 Pages.
Intel Corporation: "Resource Allocation and TBS", 3GPP Draft, 3GPP TSG RAN WG1 Meeting #90bis, R1-1717393, Intel TBS_RA, 3rd Generation Partnership Project (3GPP), Mobile Competence Centre, 650, Route Des Lucioles, F-06921 Sophia-Antipolis Cedex, France, vol. RAN WG1, No. Prague, Czech Republic, Oct. 9, 2017-Oct. 10, 2017, Oct. 8, 2017 (Oct. 8, 2017), XP051340583, 13 Pages, Retrieved from the Internet: URL: http://www.3gpp.org/ftp/Meetings_3GPP_SYNC/RAN1/Docs/ [retrieved on Oct. 8, 2017], Section 3.1.
Interdigital Inc: "Code Block Segmentation for Data Channel", R1-1714167, 3GPP TSG RAN WG1 Meeting #90, Prague, Czech Republic, Aug. 21-25, 2017, 3 Pages.
LG Electronics: "Discussion on Resource Allocation and TBS Determination", R1-1717965, 3GPP TSG RAN WG1 Meeting 90bis, Prague, CZ, Oct. 9-13, 2017, 18 Pages.
Nokia, et al., "Code Segmentation for LDPC", R1-1716558, 3GPP TSG RAN WG1 Meeting NR#3, Nagoya, Japan, Sep. 18-21, 2017, 5 Pages.
Interdigital Inc: "Remaining Issues on PT-RS", 3GPP TSG RAN WG1 #90bis, 3GPP Draft, R1-1718825, Remaining Issues on PT-RS Revision Clean, 3rd Generation Partnership Project (3GPP), Mobile Competence Centre, 650, Route Des Lucioles, F-06921 Sophia-Antipolis, France, vol. RAN WG1, No. Prague, Czech Republic, Oct. 9, 2017-Oct. 13, 2017, Oct. 9, 2017 (Oct. 9, 2017), XP051353307, 9 Pages, Retrieved From the Internet: URL:http://www.3gpp.org/ftp/tsg_ran/WG1_RL1/TSGR1_90b/Docs/ [retrieved on Oct. 9, 2017], http://www.3gpp.org/ftp/tsg_ran/WG1_RL1/TSGR1_90b/Docs/, p. 1 of Part 1 and pp. 3 to 4 of Part 2.
Taiwan Search Report—TW107140784—TIPO—dated Apr. 6, 2021.
LG Electronics: "Discussion on Resource Allocation and TBS Determination", 3GPP TSG RAN WG1 Meeting NR#3, R1-1715885, Nagoya, Japan, Sep. 18-21, 2017, 16 Pages, The Whole Document.
Nokia, et al., "On Resource Allocation for PDSCH and PUSCH in NR", R1-1718620, 3GPP TSG RAN WG1 Meeting 90bis, Prague, CZ, Oct. 9-13, 2017, 10 Pages.

* cited by examiner

METHODS AND APPARATUS FOR DETERMINING TRANSPORT BLOCK SIZE IN WIRELESS COMMUNICATION

PRIORITY CLAIM

This application is a continuation of U.S. patent application Ser. No. 16/192,697, filed Nov. 15, 2018, which claims priority to and the benefit of provisional patent application No. 62/588,137 filed in the United States Patent Office on Nov. 17, 2017, each of which is incorporated herein by reference as if fully set forth below in its entirety and for all applicable purposes.

TECHNICAL FIELD

The technology discussed below relates generally to wireless communication systems, and more particularly, a procedure for determining a transport block size of data in wireless communication.

INTRODUCTION

In wireless communication, a device may process data for transmission through a network or protocol stack including a packet data compression protocol (PDCP) layer, a radio link control (RLC) layer, a media access control (MAC) layer, and a physical (PHY) layer. The MAC layer selects the modulation and coding scheme (MCS) that configures the PHY layer. The MAC layer data provided to the PHY layer may be called a transport block (TB). In some networks, the size of a TB is not fixed and may depend on various factors such as the configured MCS and available time-frequency resources of the network. A transport block size (TBS) refers to the number of bits that can be carried in a TB. A TB may be segmented into multiple code blocks for encoding. A code block size (CBS) refers to the number of bits carried in a code block (CB).

BRIEF SUMMARY OF SOME EXAMPLES

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

One aspect of the disclosure provides a method of transmitting data in a transport block (TB) in wireless communication. A wireless device determines a maximum code block size Kb, a transport block level cyclic redundancy check size ($L_{TB,CRC}$), a code block level cyclic redundancy check size ($L_{CB,CRC}$). The wireless device further determines a number of code blocks associated with the TB based on the $K_{cb}$, $L_{TB,CRC}$, and $L_{CB,CRC}$. The wireless device further determines a code block size based on the number of code blocks. Then the wireless device determines a transport block size (TBS) of the TB in a single pass as a function of the determined $K_{cb}$, $L_{TB,CRC}$, $L_{CB,CRC}$, number of code blocks, and code block size. The wireless device transmits the TB with the data based on the determined TBS.

Another aspect of the disclosure provides a method of transmitting data in a transport block (TB) in wireless communication. A wireless device determines a transport block size (TBS) of the TB in a non-recursive procedure based on a plurality of parameters. The plurality of parameters include a maximum code block size ($K_{cb}$), a transport block level cyclic redundancy check size ($L_{TB,CRC}$), a code block level cyclic redundancy check size ($L_{CB,CRC}$), a number of code blocks associated with the TB, and a code block size K. The wireless device transmits the TB with the data based on the determined TBS.

Another aspect of the disclosure provides an apparatus of wireless communication. The apparatus includes a communication interface configured to transmit data in a transport block (TB), a memory stored with executable code, and a processor operatively coupled with the communication interface and the memory. The processor is configured by the executable code to determine a maximum code block size ($K_{cb}$), a transport block level cyclic redundancy check size ($L_{TB,CRC}$), a code block level cyclic redundancy check size ($L_{CB,CRC}$). The processor is further configured to determine a number of code blocks associated with the TB based on the $K_{cb}$, $L_{TB,CRC}$, and $L_{CB,CRC}$. The processor is further configured to determine a code block size based on the number of code blocks. Then the processor is configured to determine a transport block size (TBS) of the TB in a single pass as a function of the determined $K_{cb}$, $L_{TB,CRC}$, $L_{CB,CRC}$, number of code blocks, and code block size. The processor is further configured to transmit the TB with the data based on the determined TBS.

Another aspect of the disclosure provides an apparatus of wireless communication. The apparatus includes a communication interface configured to transmit data in a transport block (TB), a memory stored with executable code, and a processor operatively coupled with the communication interface and the memory. The processor is configured by the executable code to determine a transport block size (TBS) for the TB in a non-recursive procedure based on a plurality of parameters. The plurality of parameters include a maximum code block size, a transport block level cyclic redundancy check size, a code block level cyclic redundancy check size, a number of code blocks associated with the TB, and a code block size. The processor is further configured to transmit the TB with the data based on the determined TBS.

Another aspect of the disclosure provides an apparatus of wireless communication. The apparatus includes means for determining a maximum code block size of a transport block (TB), a transport block level cyclic redundancy check size, and a code block level cyclic redundancy check size. The apparatus further includes means for determining a number of code blocks associated with the TB based on the maximum code block size, transport block level cyclic redundancy check size, and code block level cyclic redundancy check size. The apparatus further includes means for determining a code block size based on the number of code blocks. The apparatus further includes means for determining a transport block size (TBS) for the TB in a single pass as a function of the determined maximum code block size, transport block level cyclic redundancy check size, code block level cyclic redundancy check size, number of code blocks, and code block size. The apparatus further includes means for transmitting the TB with the data based on the determined TBS.

These and other aspects of the invention will become more fully understood upon a review of the detailed description, which follows. Other aspects, features, and embodiments will become apparent to those of ordinary skill in the art, upon reviewing the following description of specific, exemplary embodiments in conjunction with the accompanying figures. While features may be discussed relative to certain embodiments and figures below, all embodiments can include one or more of the advantageous features discussed herein. In other words, while one or more embodiments may be discussed as having certain advantageous features, one or more of such features may also be used in accordance with the various embodiments discussed herein. In a similar fashion, while exemplary embodiments may be discussed below as device, system, or method embodiments it should be understood that such exemplary embodiments can be implemented in various devices, systems, and methods.

DETAILED DESCRIPTION

Figure 1:
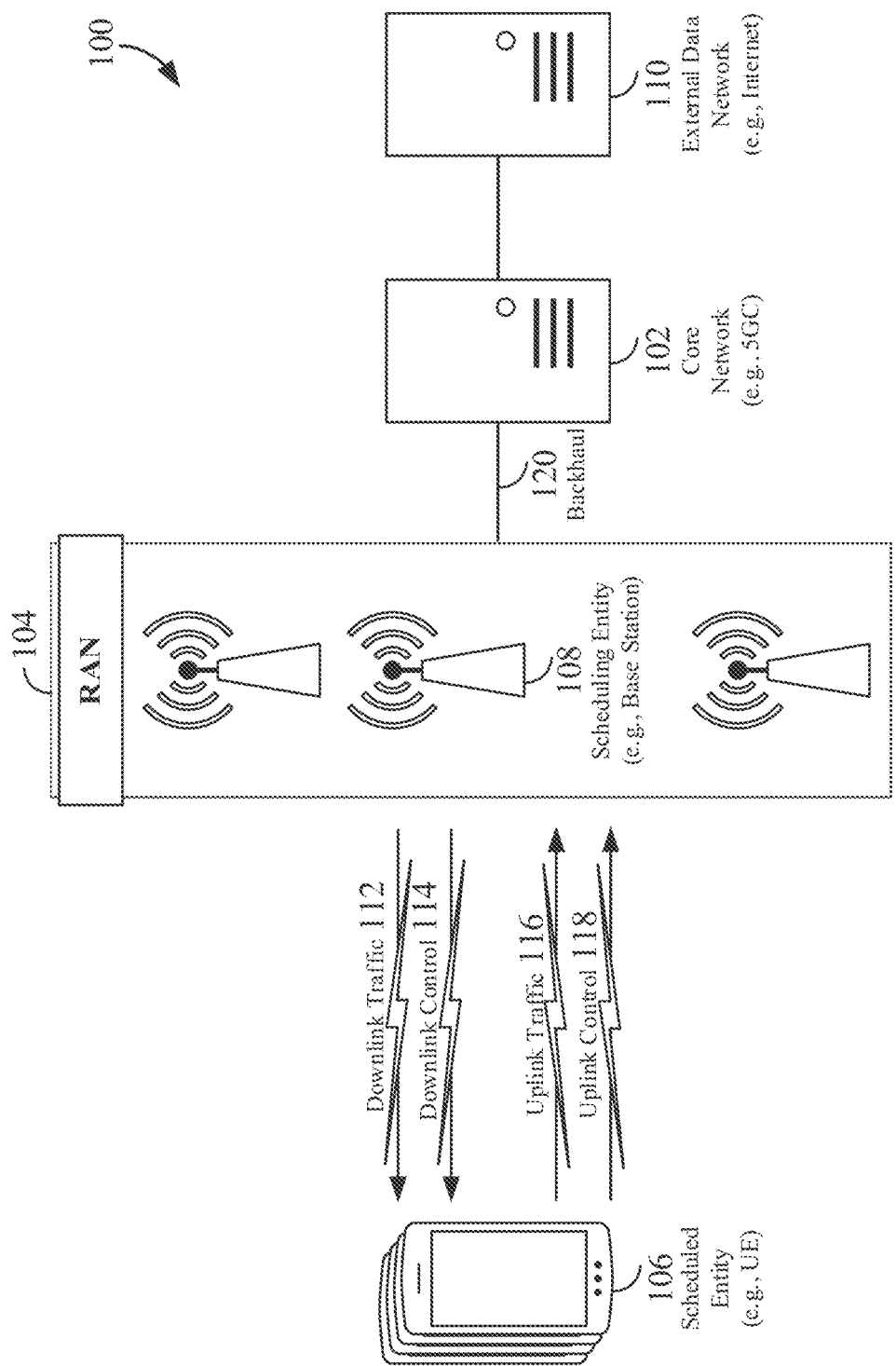
FIG. 1 is a conceptual diagram illustrating an example of a radio access network.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

While aspects and embodiments are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, embodiments and/or uses may come about via integrated chip embodiments and other non-module-component based devices (e.g., end-user devices, vehicles, communication devices, computing devices, industrial equipment, retail/purchasing devices, medical devices, AI-enabled devices, etc.). While some examples may or may not be specifically directed to use cases or applications, a wide assortment of applicability of described innovations may occur. Implementations may range a spectrum from chip-level or modular components to non-modular, non-chip-level implementations and further to aggregate, distributed, or OEM devices or systems incorporating one or more aspects of the described innovations. In some practical settings, devices incorporating described aspects and features may also necessarily include additional components and features for implementation and practice of claimed and described embodiments. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). It is intended that innovations described herein may be practiced in a wide variety of devices, chip-level components, systems, distributed arrangements, end-user devices, etc. of varying sizes, shapes and constitution.

In next-generation networks like 5G New Radio (NR), communication resource allocation is more flexible to handle diverse types of wireless communication devices and services. In current communication networks like Long-term Evolution (LTE), a wireless communication device may use a transport block size (TBS) table to determine the TBS. However, such approach may result in an undesirably large TBS table due to various slot configurations, demodulation reference signal (DMRS) assumptions, use of control resources, and many other flexibilities provided in next-generation networks.

Some aspects of the present disclosure provide apparatuses and methods for determining a transport block size (TB S) as a function of various parameters without cyclic dependencies between the parameters and TBS. The disclosed function can determine a TBS in a single pass, and the determined TBS allows the use of code blocks with equal code block size (CBS) in a transport block segmentation process. In addition, the determined TBS provides byte-aligned code block lengths and requires no padding bits in a transport block.

The various concepts presented throughout this disclosure may be implemented across a broad variety of telecommunication systems, network architectures, and communication standards. Referring now to FIG. 1, as an illustrative example without limitation, various aspects of the present disclosure are illustrated with reference to a wireless communication system 100. The wireless communication system 100 includes three interacting domains: a core network 102, a radio access network (RAN) 104, and a user equipment (UE) 106. By virtue of the wireless communication system 100, the UE 106 may be enabled to carry out data communication with an external data network 110, such as (but not limited to) the Internet.

The RAN 104 may implement any suitable wireless communication technology or technologies to provide radio access to the UE 106. As one example, the RAN 104 may operate according to 3$^{rd}$ Generation Partnership Project (3GPP) New Radio (NR) specifications, often referred to as 5G. As another example, the RAN 104 may operate under a hybrid of 5G NR and Evolved Universal Terrestrial Radio Access Network (eUTRAN) standards, often referred to as LTE. The 3GPP refers to this hybrid RAN as a next-generation RAN, or NG-RAN. Of course, many other examples may be utilized within the scope of the present disclosure.

As illustrated, the RAN 104 includes a plurality of base stations 108. Broadly, a base station is a network element in a radio access network responsible for radio transmission and reception in one or more cells to or from a UE. In different technologies, standards, or contexts, a base station may variously be referred to by those skilled in the art as a base transceiver station (BTS), a radio base station, a radio transceiver, a transceiver function, a basic service set (BSS), an extended service set (ESS), an access point (AP), a Node B (NB), an eNode B (eNB), a gNode B (gNB), or some other suitable terminology.

The radio access network 104 is further illustrated supporting wireless communication for multiple mobile apparatuses. A mobile apparatus may be referred to as user equipment (UE) in 3GPP standards, but may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. A UE may be an apparatus (e.g., a mobile apparatus) that provides a user with access to network services.

Within the present document, a "mobile" apparatus need not necessarily have a capability to move, and may be stationary. The term mobile apparatus or mobile device broadly refers to a diverse array of devices and technologies. UEs may include a number of hardware structural components sized, shaped, and arranged to help in communication; such components can include antennas, antenna arrays, RF chains, amplifiers, one or more processors, etc. electrically coupled to each other. For example, some non-limiting examples of a mobile apparatus include a mobile, a cellular (cell) phone, a smart phone, a session initiation protocol (SIP) phone, a laptop, a personal computer (PC), a notebook, a netbook, a smartbook, a tablet, a personal digital assistant (PDA), and a broad array of embedded systems, e.g., corresponding to an "Internet of things" (IoT). A mobile apparatus may additionally be an automotive or other transportation vehicle, a remote sensor or actuator, a robot or robotics device, a satellite radio, a global positioning system (GPS) device, an object tracking device, a drone, a multicopter, a quad-copter, a remote control device, a consumer and/or wearable device, such as eyewear, a wearable camera, a virtual reality device, a smart watch, a health or fitness tracker, a digital audio player (e.g., MP3 player), a camera, a game console, etc. A mobile apparatus may additionally be a digital home or smart home device such as a home audio, video, and/or multimedia device, an appliance, a vending machine, intelligent lighting, a home security system, a smart meter, etc. A mobile apparatus may additionally be a smart energy device, a security device, a solar panel or solar array, a municipal infrastructure device controlling electric power (e.g., a smart grid), lighting, water, etc.; an industrial automation and enterprise device; a logistics controller; agricultural equipment; military defense equipment, vehicles, aircraft, ships, and weaponry, etc. Still further, a mobile apparatus may provide for connected medicine or telemedicine support, e.g., health care at a distance. Telehealth devices may include telehealth monitoring devices and telehealth administration devices, whose communication may be given preferential treatment or prioritized access over other types of information, e.g., in terms of prioritized access for transport of critical service data, and/or relevant QoS for transport of critical service data.

Wireless communication between a RAN 104 and a UE 106 may be described as utilizing an air interface. Transmissions over the air interface from a base station (e.g., base station 108) to one or more UEs (e.g., UE 106) may be referred to as downlink (DL) transmission. In accordance with certain aspects of the present disclosure, the term downlink may refer to a point-to-multipoint transmission originating at a scheduling entity (described further below; e.g., base station 108). Another way to describe this scheme may be to use the term broadcast channel multiplexing. Transmissions from a UE (e.g., UE 106) to a base station (e.g., base station 108) may be referred to as uplink (UL) transmissions. In accordance with further aspects of the present disclosure, the term uplink may refer to a point-to-point transmission originating at a scheduled entity (described further below; e.g., UE 106).

In some examples, access to the air interface may be scheduled, wherein a scheduling entity (e.g., a base station 108) allocates resources for communication among some or all devices and equipment within its service area or cell. Within the present disclosure, as discussed further below, the scheduling entity may be responsible for scheduling, assigning, reconfiguring, and releasing resources for one or more scheduled entities. That is, for scheduled communication, UEs 106, which may be scheduled entities, may utilize resources allocated by the scheduling entity 108.

Base stations 108 are not the only entities that may function as scheduling entities. That is, in some examples, a UE may function as a scheduling entity, scheduling resources for one or more scheduled entities (e.g., one or more other UEs).

As illustrated in FIG. 1, a scheduling entity 108 may broadcast downlink traffic 112 to one or more scheduled entities 106. Broadly, the scheduling entity 108 is a node or device responsible for scheduling traffic in a wireless communication network, including the downlink traffic 112 and, in some examples, uplink traffic 116 from one or more scheduled entities 106 to the scheduling entity 108. On the other hand, the scheduled entity 106 is a node or device that receives downlink control information 114, including but not limited to scheduling information (e.g., a grant), synchronization or timing information, or other control information from another entity in the wireless communication network such as the scheduling entity 108.

In general, base stations 108 may include a backhaul interface for communication with a backhaul portion 120 of the wireless communication system. The backhaul 120 may provide a link between a base station 108 and the core network 102. Further, in some examples, a backhaul network may provide interconnection between the respective base stations 108. Various types of backhaul interfaces may be employed, such as a direct physical connection, a virtual network, or the like using any suitable transport network.

The core network 102 may be a part of the wireless communication system 100, and may be independent of the radio access technology used in the RAN 104. In some examples, the core network 102 may be configured according to 5G standards (e.g., 5GC). In other examples, the core network 102 may be configured according to a 4G evolved packet core (EPC), or any other suitable standard or configuration.

Figure 2:
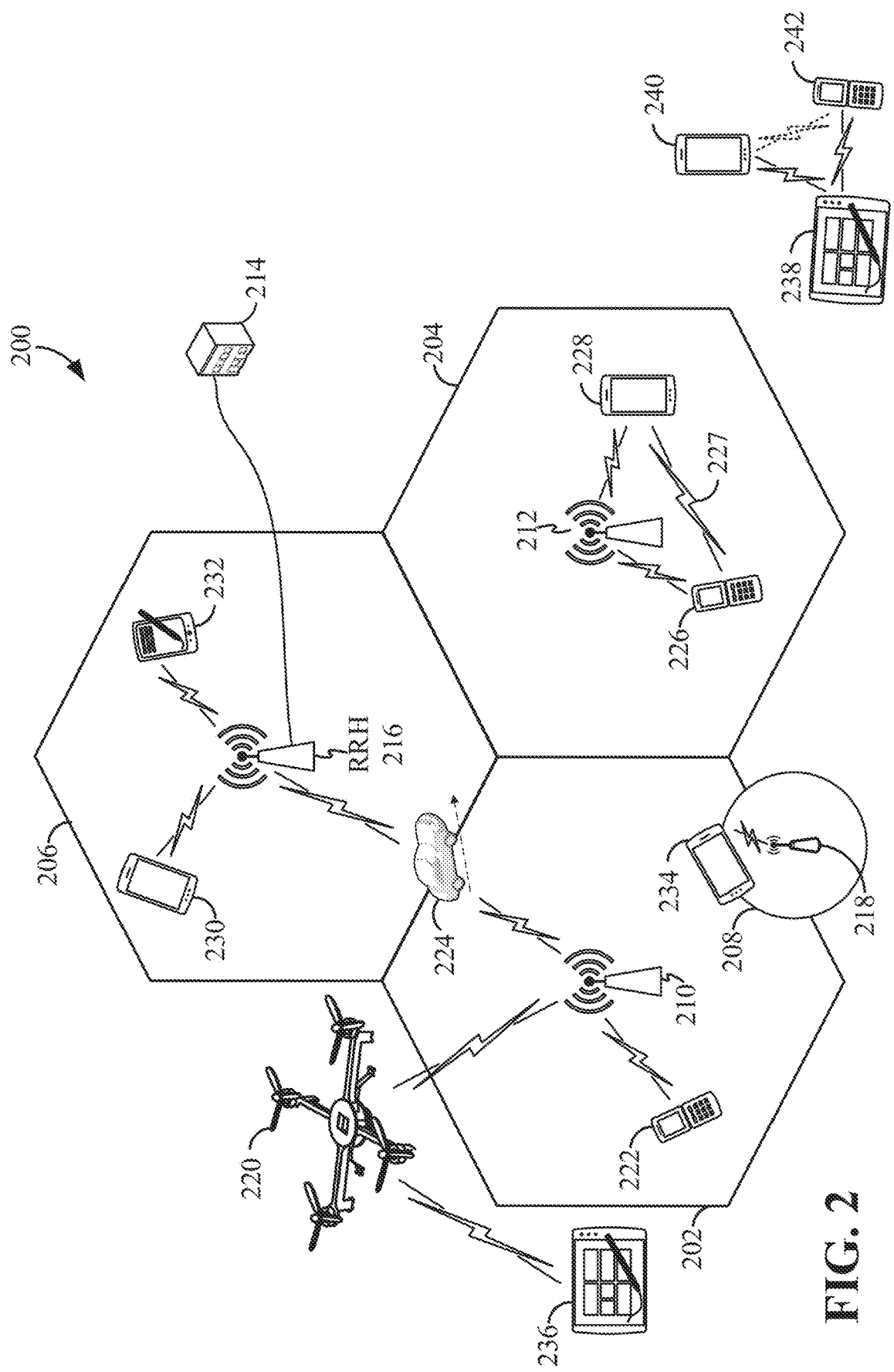
FIG. 2 is a block diagram conceptually illustrating an example of a scheduling entity communicating with one or more scheduled entities according to some aspects of the present disclosure.

Referring now to FIG. 2, by way of example and without limitation, a schematic illustration of a RAN 200 is provided. In some examples, the RAN 200 may be the same as the RAN 104 described above and illustrated in FIG. 1. The geographic area covered by the RAN 200 may be divided into cellular regions (cells) that can be uniquely identified by a user equipment (UE) based on an identification broadcasted from one access point or base station. FIG. 2 illustrates macrocells 202, 204, and 206, and a small cell 208, each of which may include one or more sectors (not shown). A sector is a sub-area of a cell. All sectors within one cell are served by the same base station. A radio link within a sector can be identified by a single logical identification belonging to that sector. In a cell that is divided into sectors, the multiple sectors within a cell can be formed by groups of antennas with each antenna responsible for communication with UEs in a portion of the cell.

In FIG. 2, two base stations 210 and 212 are shown in cells 202 and 204; and a third base station 214 is shown controlling a remote radio head (RRH) 216 in cell 206. That is, a base station can have an integrated antenna or can be connected to an antenna or RRH by feeder cables. In the illustrated example, the cells 202, 204, and 126 may be referred to as macrocells, as the base stations 210, 212, and 214 support cells having a large size. Further, a base station 218 is shown in the small cell 208 (e.g., a microcell, picocell, femtocell, home base station, home Node B, home eNode B, etc.) which may overlap with one or more macrocells. In this example, the cell 208 may be referred to as a small cell, as the base station 218 supports a cell having a relatively small size. Cell sizing can be done according to system design as well as component constraints.

It is to be understood that the radio access network 200 may include any number of wireless base stations and cells. Further, a relay node may be deployed to extend the size or coverage area of a given cell. The base stations 210, 212, 214, 218 provide wireless access points to a core network for any number of mobile apparatuses. In some examples, the base stations 210, 212, 214, and/or 218 may be the same as the base station/scheduling entity 108 described above and illustrated in FIG. 1.

FIG. 2 further includes a quadcopter or drone 220, which may be configured to function as a base station. That is, in some examples, a cell may not necessarily be stationary, and the geographic area of the cell may move according to the location of a mobile base station such as the quadcopter 220.

Within the RAN 200, the cells may include UEs that may be in communication with one or more sectors of each cell. Further, each base station 210, 212, 214, 218, and 220 may be configured to provide an access point to a core network 102 (see FIG. 1) for all the UEs in the respective cells. For example, UEs 222 and 224 may be in communication with base station 210; UEs 226 and 228 may be in communication with base station 212; UEs 230 and 232 may be in communication with base station 214 by way of RRH 216; UE 234 may be in communication with base station 218; and UE 236 may be in communication with mobile base station 220. In some examples, the UEs 222, 224, 226, 228, 230, 232, 234, 236, 238, 240, and/or 242 may be the same as the UE/scheduled entity 106 described above and illustrated in FIG. 1.

In some examples, a mobile network node (e.g., quadcopter 220) may be configured to function as a UE. For example, the quadcopter 220 may operate within cell 202 by communicating with base station 210.

In a further aspect of the RAN 200, sidelink signals may be used between UEs without necessarily relying on scheduling or control information from a base station. For example, two or more UEs (e.g., UEs 226 and 228) may communicate with each other using peer to peer (P2P) or sidelink signals 227 without relaying that communication through a base station (e.g., base station 212). In a further example, UE 238 is illustrated communicating with UEs 240 and 242. Here, the UE 238 may function as a scheduling entity or a primary sidelink device, and UEs 240 and 242 may function as a scheduled entity or a non-primary (e.g., secondary) sidelink device. In still another example, a UE may function as a scheduling entity in a device-to-device (D2D), peer-to-peer (P2P), or vehicle-to-vehicle (V2V) network, and/or in a mesh network. In a mesh network example, UEs 240 and 242 may optionally communicate directly with one another in addition to communicating with the scheduling entity 238. Thus, in a wireless communication system with scheduled access to time-frequency resources and having a cellular configuration, a P2P configuration, or a mesh configuration, a scheduling entity and one or more scheduled entities may communicate utilizing the scheduled resources.

In the radio access network 200, the ability for a UE to communicate while moving, independent of its location, is referred to as mobility. The various physical channels between the UE and the radio access network are generally set up, maintained, and released under the control of an access and mobility management function (AMF, not illustrated, part of the core network 102 in FIG. 1), which may include a security context management function (SCMF) that manages the security context for both the control plane and the user plane functionality, and a security anchor function (SEAF) that performs authentication.

In various aspects of the disclosure, a radio access network 200 may utilize DL-based mobility or UL-based mobility to enable mobility and handovers (i.e., the transfer of a UE's connection from one radio channel to another). In a network configured for DL-based mobility, during a call with a scheduling entity, or at any other time, a UE may monitor various parameters of the signal from its serving cell as well as various parameters of neighboring cells. Depending on the quality of these parameters, the UE may maintain communication with one or more of the neighboring cells. During this time, if the UE moves from one cell to another, or if signal quality from a neighboring cell exceeds that from the serving cell for a given amount of time, the UE may undertake a handoff or handover from the serving cell to the neighboring (target) cell. For example, UE 224 (illustrated as a vehicle, although any suitable form of UE may be used) may move from the geographic area corresponding to its serving cell 202 to the geographic area corresponding to a neighbor cell 206. When the signal strength or quality from the neighbor cell 206 exceeds that of its serving cell 202 for a given amount of time, the UE 224 may transmit a reporting message to its serving base station 210 indicating this condition. In response, the UE 224 may receive a handover command, and the UE may undergo a handover to the cell 206.

In a network configured for UL-based mobility, UL reference signals from each UE may be utilized by the network to select a serving cell for each UE. In some examples, the base stations 210, 212, and 214/216 may broadcast unified synchronization signals (e.g., unified Primary Synchronization Signals (PSSs), unified Secondary Synchronization Signals (SSSs) and unified Physical Broadcast Channels (PBCH)). The UEs 222, 224, 226, 228, 230, and 232 may receive the unified synchronization signals, derive the carrier frequency and slot timing from the synchronization signals, and in response to deriving timing, transmit an uplink pilot or reference signal. The uplink pilot signal transmitted by a UE (e.g., UE 224) may be concurrently received by two or more cells (e.g., base stations 210 and 214/216) within the radio access network 200. Each of the cells may measure a strength of the pilot signal, and the radio access network (e.g., one or more of the base stations 210 and 214/216 and/or a central node within the core network) may determine a serving cell for the UE 224. As the UE 224 moves through the radio access network 200, the network may continue to monitor the uplink pilot signal transmitted by the UE 224. When the signal strength or quality of the pilot signal measured by a neighboring cell exceeds that of the signal strength or quality measured by the serving cell, the network 200 may handover the UE 224 from the serving cell to the neighboring cell, with or without informing the UE 224.

Although the synchronization signal transmitted by the base stations 210, 212, and 214/216 may be unified, the synchronization signal may not identify a particular cell, but rather may identify a zone of multiple cells operating on the same frequency and/or with the same timing. The use of zones in 5G networks or other next-generation communication networks enables the uplink-based mobility framework and improves the efficiency of both the UE and the network, since the number of mobility messages that need to be exchanged between the UE and the network may be reduced.

In various implementations, the air interface in the radio access network 200 may utilize licensed spectrum, unlicensed spectrum, or shared spectrum. Licensed spectrum provides for exclusive use of a portion of the spectrum, generally by virtue of a mobile network operator purchasing a license from a government regulatory body. Unlicensed spectrum provides for shared use of a portion of the spectrum without need for a government-granted license. While compliance with some technical rules is generally still required to access unlicensed spectrum, generally, any operator or device may gain access. Shared spectrum may fall between licensed and unlicensed spectrum, wherein technical rules or limitations may be required to access the spectrum, but the spectrum may still be shared by multiple operators and/or multiple RATs. For example, the holder of a license for a portion of licensed spectrum may provide licensed shared access (LSA) to share that spectrum with other parties, e.g., with suitable licensee-determined conditions to gain access.

The air interface in the radio access network 200 may utilize one or more duplexing algorithms. Duplex refers to a point-to-point communication link where both endpoints can communicate with one another in both directions. Full duplex means both endpoints can simultaneously communicate with one another. Half duplex means only one endpoint can send information to the other at a time. In a wireless link, a full duplex channel generally relies on physical isolation of a transmitter and receiver, and suitable interference cancellation technologies. Full duplex emulation is frequently implemented for wireless links by utilizing frequency division duplex (FDD) or time division duplex (TDD). In FDD, transmissions in different directions operate at different carrier frequencies. In TDD, transmissions in different directions on a given channel are separated from one another using time division multiplexing. That is, at some times the channel is dedicated for transmissions in one direction, while at other times the channel is dedicated for transmissions in the other direction, where the direction may change very rapidly, e.g., several times per slot.

Figure 3:
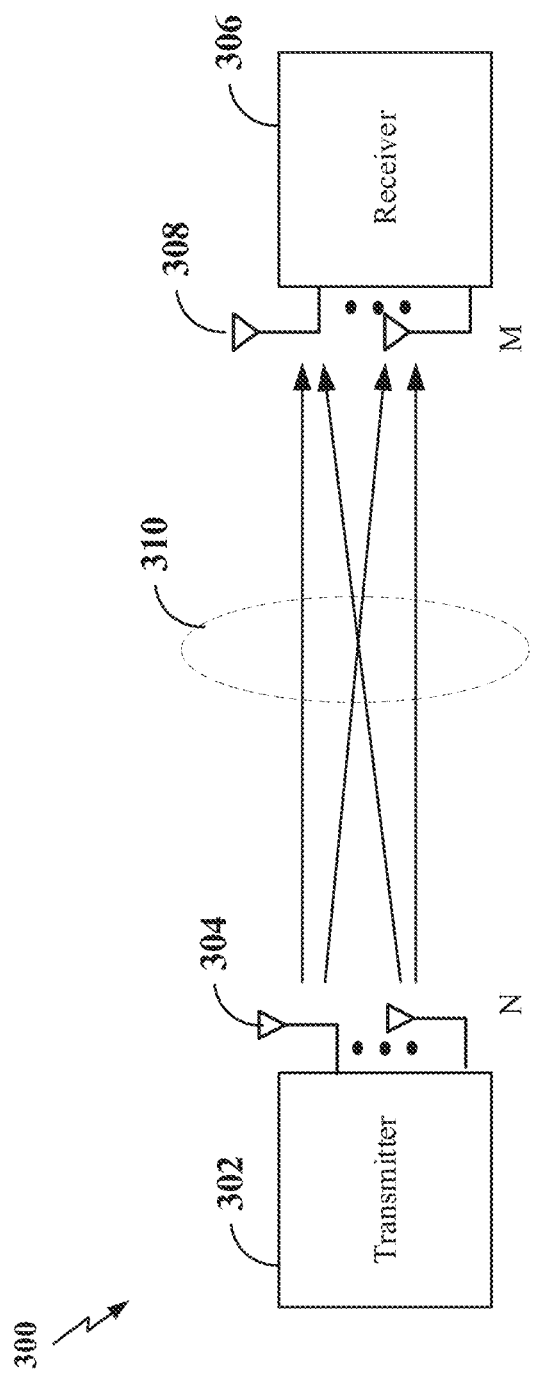
FIG. 3 illustrates an example of a wireless communication system supporting multiple-input multiple-output (MIMO).

In some aspects of the disclosure, the scheduling entity and/or scheduled entity may be configured for beamforming and/or multiple-input multiple-output (MIMO) technology. FIG. 3 illustrates an example of a wireless communication system 300 supporting MIMO. In a MIMO system, a transmitter 302 includes multiple transmit antennas 304 (e.g., N transmit antennas) and a receiver 306 includes multiple receive antennas 308 (e.g., M receive antennas). Thus, there are N×M signal paths 310 from the transmit antennas 304 to the receive antennas 308. Each of the transmitter 302 and the receiver 306 may be implemented, for example, within a scheduling entity 108, a scheduled entity 106, or any other suitable wireless communication device.

The use of such multiple antenna technology enables the wireless communication system to exploit the spatial domain to support spatial multiplexing, beamforming, and transmit diversity. Spatial multiplexing may be used to transmit different streams of data, also referred to as layers, simultaneously on the same time-frequency resource. The number of data streams or layers corresponds to the rank of the transmission. In general, the rank of the MIMO system 300 is limited by the number of transmit or receive antennas 304 or 308, whichever is lower. In addition, the channel conditions at the UE, as well as other considerations, such as the available resources at the base station, may also affect the transmission rank. For example, the rank (and therefore, the number of data streams) assigned to a particular UE on the downlink may be determined based on the rank indicator (RI) transmitted from the UE to the base station. The RI may be determined based on the antenna configuration (e.g., the number of transmit and receive antennas) and a measured signal-to-interference-and-noise ratio (SINR) on each of the receive antennas. The RI may indicate, for example, the number of layers that may be supported under the current channel conditions. The base station may use the RI, along with resource information (e.g., the available resources and amount of data to be scheduled for the UE), to assign a transmission rank to the UE.

In the simplest case, as shown in FIG. 3, a rank-2 spatial multiplexing transmission on a 2×2 MIMO antenna configuration will transmit one data stream from each transmit antenna 304. Each data stream reaches each receive antenna 308 along a different signal path 310. The receiver 306 may then reconstruct the data streams using the received signals from each receive antenna 308.

In order for transmissions over the radio access network 200 to obtain a low block error rate (BLER) while still achieving very high data rates, channel coding may be used. That is, wireless communication may generally utilize a suitable error correcting block code. In a typical block code, an information message or sequence is split up into code blocks (CBs), and an encoder (e.g., a CODEC) at the transmitting device then mathematically adds redundancy to the information message. Exploitation of this redundancy in the encoded information message can improve the reliability of the message, enabling correction for any bit errors that may occur due to the noise.

In early 5G NR specifications, user data is coded using quasi-cyclic low-density parity check (LDPC) with two different base graphs: one base graph is used for large code blocks and/or high code rates, while the other base graph is used otherwise. Control information and the physical broadcast channel (PBCH) are coded using Polar coding, based on nested sequences. For these channels, puncturing, shortening, and repetition are used for rate matching.

A base graph (BG) refers to LPDC codes that have certain performance characteristics such as a maximum code rate and a minimum code rate. In one example, a first base graph (BG1) can support a minimum code rate of 1/3, and a second base graph (BG2) can support a minimum code rate of 1/5.

The maximum size of a code block depends on the base graph. A base graph (e.g., BG1 and BG2) is selected to provide better performance based on code block sizes or lengths. For example, BG2 is generally used for lower code rates than those for BG1. Examples of base graphs may be found in the 3GPP standards such as Technical Specification 38.212 v 1.1.2, Multiplexing and channel coding (Release 15).

In one example, for initial transmissions with code rate ($R_{init}$) greater than 1/4, BG2 is not used when TBS is greater 3824 bits. However, BG2 is used for initial transmissions with code rate less than or equal to 1/4 for all TBS supported at that code rate. When BG2 is used with TBS greater than 3824 bits, the TB is segmented into code blocks no larger than 3840 bits.

In one aspect of the disclosure, for a code block size (K) less than or equal to 308 bit, BG2 may be used for all code rates. In the 5G NR standards, the maximum code block size ($K_{cb}$) is 8448 bits for use with BG1 and 3840 bits for use with BG2. In one example, BG1 is used for the initial transmission and subsequent re-transmissions of the same TB when CBS is greater than X (e.g., X=3840) or code rate of the initial transmission is greater than Y (e.g., Y=0.67). In one example, BG2 is used for the initial transmission and subsequent re-transmissions of the same TB, when CBS is less or equal to X and code rate of the initial transmission is less than or equal to Y.

However, those of ordinary skill in the art will understand that aspects of the present disclosure may be implemented utilizing any suitable channel code. Various implementations of scheduling entities 108 and scheduled entities 106 may include suitable hardware and capabilities (e.g., an encoder, a decoder, and/or a CODEC) to utilize one or more of these channel codes for wireless communication.

The air interface in the radio access network 200 may utilize one or more multiplexing and multiple access algorithms to enable simultaneous communication of the various devices. For example, 5G NR specifications provide multiple access for UL transmissions from UEs 222 and 224 to base station 210, and for multiplexing for DL transmissions from base station 210 to one or more UEs 222 and 224, utilizing orthogonal frequency division multiplexing (OFDM) with a cyclic prefix (CP). In addition, for UL transmissions, 5G NR specifications provide support for discrete Fourier transform-spread-OFDM (DFT-s-OFDM) with a CP (also referred to as single-carrier I-DMA (SC-FDMA)). However, within the scope of the present disclosure, multiplexing and multiple access are not limited to the above schemes, and may be provided utilizing time division multiple access (TDMA), code division multiple access (CDMA), frequency division multiple access (FDMA), sparse code multiple access (SCMA), resource spread multiple access (RSMA), or other suitable multiple access schemes. Further, multiplexing DL transmissions from the base station 210 to UEs 222 and 224 may be provided utilizing time division multiplexing (TDM), code division multiplexing (CDM), frequency division multiplexing (FDM), orthogonal frequency division multiplexing (OFDM), sparse code multiplexing (SCM), or other suitable multiplexing schemes.

Various aspects of the present disclosure will be described with reference to an OFDM waveform, schematically illustrated in FIG. 4. It should be understood by those of ordinary skill in the art that the various aspects of the present disclosure may be applied to a DFT-s-OFDMA waveform in substantially the same way as described hereinbelow. That is, while some examples of the present disclosure may focus on an OFDM link for clarity, it should be understood that the same principles may be applied as well to DFT-s-OFDMA waveforms.

Within the present disclosure, a frame refers to a predetermined duration (e.g., 10 ms) for wireless transmissions, with each frame consisting of a certain number of subframes (e.g., 10 subframes of 1 ms each). On a given carrier, there may be one set of frames in the UL, and another set of frames in the DL. Referring now to FIG. 4, an expanded view of an exemplary DL subframe 402 is illustrated, showing an OFDM resource grid 404. However, as those skilled in the art will readily appreciate, the PHY transmission structure for any particular application may vary from the example described here, depending on any number of factors. Here, time is in the horizontal direction with units of OFDM symbols; and frequency is in the vertical direction with units of subcarriers or tones.

The resource grid 404 may be used to schematically represent time-frequency resources for a given antenna port. The resource grid 404 is divided into multiple resource elements (REs) 406. An RE, which is 1 subcarrier×1 symbol, is the smallest discrete part of the time-frequency grid, and contains a single complex value representing data from a physical channel or signal. Depending on the modulation utilized in a particular implementation, each RE may represent one or more bits of information. In some examples, a block of REs may be referred to as a physical resource block (PRB) or more simply a resource block (RB) 408, which contains any suitable number of consecutive subcarriers in the frequency domain. In one example, an RB may include 12 subcarriers, a number independent of the numerology used. In some examples, depending on the numerology, an RB may include any suitable number of consecutive OFDM symbols in the time domain. Within the present disclosure, it is assumed that a single RB such as the RB 408 entirely corresponds to a single direction of communication (either transmission or reception for a given device).

A UE generally utilizes only a subset of the resource grid 404. An RB may be the smallest unit of resources that can be allocated to a UE. Thus, the more RBs scheduled for a UE, and the higher the modulation scheme chosen for the air interface, the higher the data rate for the UE.

In this illustration, the RB 408 is shown as occupying less than the entire bandwidth of the subframe 402, with some subcarriers illustrated above and below the RB 408. In a given implementation, the subframe 402 may have a bandwidth corresponding to any number of one or more RBs 408. Further, in this illustration, the RB 408 is shown as occupying less than the entire duration of the subframe 402, although this is merely one possible example.

Each subframe 402 (e.g., 1 ms subframe) may consist of one or multiple adjacent slots. In the example shown in FIG. 4, one subframe 402 includes four slots 410, as an illustrative example. In some examples, a slot may be defined according to a specified number of OFDM symbols with a given cyclic prefix (CP) length. For example, a slot may include 7 or 14 OFDM symbols with a nominal CP. Additional examples may include mini-slots having a shorter duration (e.g., 1, 2, 4, or 7 OFDM symbols). These mini-slots may in some cases be transmitted occupying resources scheduled for ongoing slot transmissions for the same or for different UEs.

An expanded view of one of the slots 410 illustrates the slot 410 including a control region 412 and a data region 414. In general, the control region 412 may carry control channels (e.g., PDCCH), and the data region 414 may carry data channels (e.g., PDSCH or PUSCH). Of course, a slot may contain all DL, all UL, or at least one DL portion and at least one UL portion. The simple structure illustrated in FIG. 4 is merely exemplary in nature, and different slot structures may be utilized, and may include one or more of each of the control region(s) and data region(s).

Figure 4:
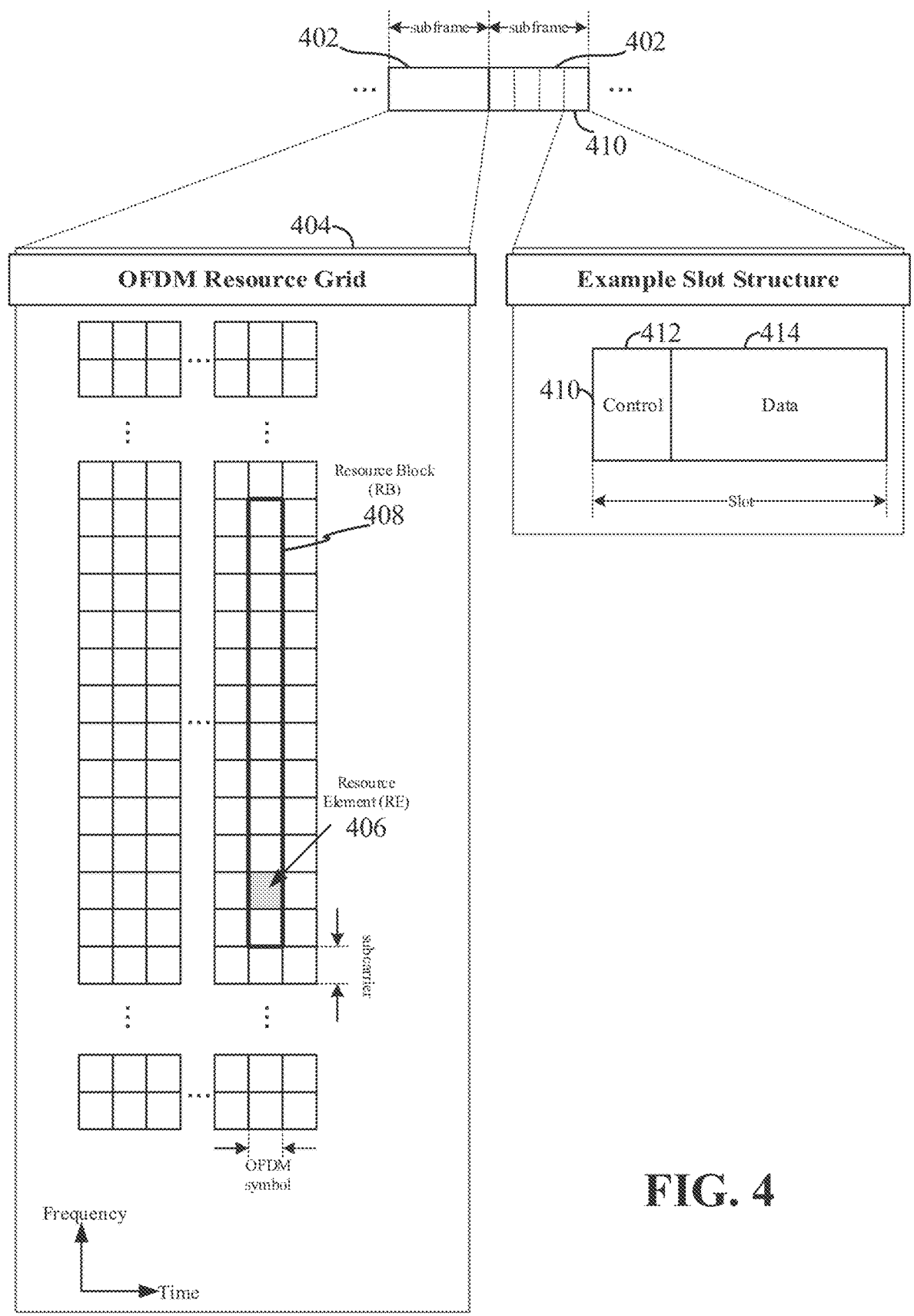
FIG. 4 is a schematic diagram illustrating an organization of wireless resources in an air interface utilizing orthogonal frequency divisional multiplexing (OFDM).

Although not illustrated in FIG. 4, the various REs 406 within a RB 408 may be scheduled to carry one or more physical channels, including control channels, shared channels, data channels, etc. Other REs 406 within the RB 408 may also carry pilots or reference signals, including but not limited to a demodulation reference signal (DMRS) a control reference signal (CRS), or a sounding reference signal (SRS). These pilots or reference signals may provide for a receiving device to perform channel estimation of the corresponding channel, which may enable coherent demodulation/detection of the control and/or data channels within the RB 408.

In a DL transmission, the transmitting device (e.g., the scheduling entity 108) may allocate one or more REs 406 (e.g., within a control region 412) to carry DL control information 114 including one or more DL control channels that generally carry information originating from higher layers, such as a physical broadcast channel (PBCH), a physical downlink control channel (PDCCH), etc., to one or more scheduled entities 106. In addition, DL REs may be allocated to carry DL physical signals that generally do not carry information originating from higher layers. These DL physical signals may include a primary synchronization signal (PSS); a secondary synchronization signal (SSS); demodulation reference signals (DM-RS); phase-tracking reference signals (PT-RS); channel-state information reference signals (CSI-RS); etc. The PDCCH may carry downlink control information (DCI) for one or more UEs in a cell. This can include, but is not limited to, power control commands, scheduling information, a grant, and/or an assignment of REs for DL and UL transmissions.

In an UL transmission, a transmitting device (e.g., a scheduled entity 106) may utilize one or more REs 406 to carry UL control information 118 (UCI). The UCI can originate from higher layers via one or more UL control channels, such as a physical uplink control channel (PUCCH), a physical random access channel (PRACH), etc., to the scheduling entity 108. Further, UL REs may carry UL physical signals that generally do not carry information originating from higher layers, such as demodulation reference signals (DM-RS), phase-tracking reference signals (PT-RS), sounding reference signals (SRS), etc. In some examples, the control information 118 may include a scheduling request (SR), i.e., a request for the scheduling entity 108 to schedule uplink transmissions. Here, in response to the SR transmitted on the control channel 118, the scheduling entity 108 may transmit downlink control information 114 that may schedule resources for uplink packet transmissions.

UL control information may also include hybrid automatic repeat request (HARQ) feedback such as an acknowledgment (ACK) or negative acknowledgment (NACK), channel state information (CSI), or any other suitable UL control information. HARQ is a technique well-known to those of ordinary skill in the art, wherein the integrity of packet transmissions may be checked at the receiving side for accuracy, e.g., utilizing any suitable integrity checking mechanism, such as a checksum or a cyclic redundancy check (CRC). If the integrity of the transmission confirmed, an ACK may be transmitted, whereas if not confirmed, a NACK may be transmitted. In response to a NACK, the transmitting device may send a HARQ retransmission, which may implement chase combining, incremental redundancy, etc.

In addition to control information, one or more REs 406 (e.g., within the data region 414) may be allocated for user data or traffic data. Such traffic may be carried on one or more traffic channels, such as, for a DL transmission, a physical downlink shared channel (PDSCH); or for an UL transmission, a physical uplink shared channel (PUSCH).

The channels or carriers described above and illustrated in FIGS. 1, 2 and 3 are not necessarily all the channels or carriers that may be utilized between a scheduling entity 108 and scheduled entities 106, and those of ordinary skill in the art will recognize that other channels or carriers may be utilized in addition to those illustrated, such as other traffic, control, and feedback channels.

These physical channels described above are generally multiplexed and mapped to transport channels for handling at the medium access control (MAC) layer. Transport channels carry blocks of information called transport blocks (TB). The transport block size (TBS), which may correspond to a number of bits of information, may be a controlled parameter, based on the modulation and coding scheme (MCS) and the number of RBs in a given transmission.

Figure 5:
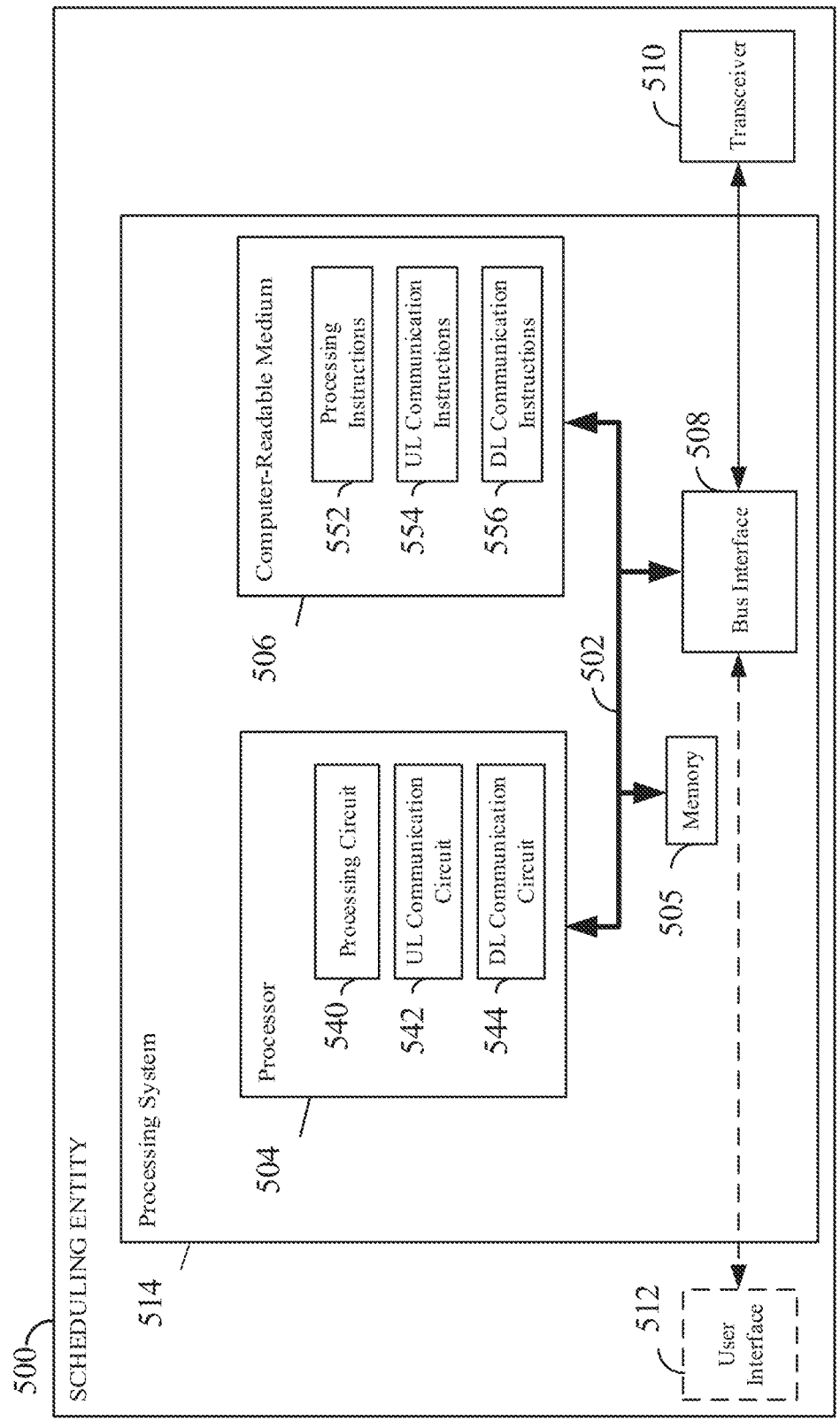
FIG. 5 is a block diagram conceptually illustrating an example of a hardware implementation for a scheduling entity according to some aspects of the disclosure.

FIG. 5 is a block diagram illustrating an example of a hardware implementation for a scheduling entity 500 employing a processing system 514. For example, the scheduling entity 500 may be a user equipment (UE) as illustrated in any one or more of FIGS. 1, 2, and/or 3. In another example, the scheduling entity 500 may be a base station as illustrated in any one or more of FIGS. 1, 2, and/or 3.

The scheduling entity 500 may be implemented with a processing system 514 that includes one or more processors 504. Examples of processors 504 include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In various examples, the scheduling entity 500 may be configured to perform any one or more of the functions described herein. That is, the processor 504, as utilized in a scheduling entity 500, may be used to implement any one or more of the processes and procedures described below and illustrated in FIGS. 7-10.

In this example, the processing system 514 may be implemented with a bus architecture, represented generally by the bus 502. The bus 502 may include any number of interconnecting buses and bridges depending on the specific application of the processing system 514 and the overall design constraints. The bus 502 communicatively couples together various circuits including one or more processors (represented generally by the processor 504), a memory 505, and computer-readable media (represented generally by the computer-readable medium 506). The bus 502 may also link various other circuits such as timing sources, peripherals, voltage regulators, and power management circuits, which are well known in the art, and therefore, will not be described any further. A bus interface 508 provides an interface between the bus 502 and a transceiver 510. The transceiver 510 provides a communication interface or means for communicating with various other apparatus over a transmission medium. Depending upon the nature of the apparatus, a user interface 512 (e.g., keypad, display, speaker, microphone, joystick) may also be provided. Of course, such a user interface 512 is optional, and may be omitted in some examples, such as a base station.

In some aspects of the disclosure, the processor 504 may include circuitry configured for various functions, including, for example, base graph selection and transport block size determination used in wireless communication. For example, the circuitry may be configured to implement one or more of the functions described below in relation to FIGS. 7-10. The processor 504 may include a processing circuit 540 that can be configured by processing instructions 522 to perform various data processing functions used in wireless communication. The processor 504 may include an uplink (UL) communication circuit 542 that can be configured by UL communication instructions 554 to perform various functions used in UL communication. For example, the UL communication circuit 542 may schedule and allocate resources (e.g., MIMO layers, PRBs) for UL communication. The UL communication circuit 542 may configure the target code rate, and modulation and coding scheme used in UL communication. The processor 504 may include a downlink (DL) communication circuit 544 that can be configured by DL communication instructions 556 to perform various functions used in DL communication. For example, the DL communication circuit 544 may schedule and allocate resources (e.g., MIMO layers, PRBs) for DL communication. The DL communication circuit 544 may configure the target code rate, and modulation and coding scheme used in DL communication.

The processor 504 is responsible for managing the bus 502 and general processing, including the execution of software stored on the computer-readable medium 506. The software, when executed by the processor 504, causes the processing system 514 to perform the various functions described below for any particular apparatus. The computer-readable medium 506 and the memory 505 may also be used for storing data that is manipulated by the processor 504 when executing software.

One or more processors 504 in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium 506. The computer-readable medium 506 may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium 506 may reside in the processing system 514, external to the processing system 514, or distributed across multiple entities including the processing system 514. The computer-readable medium 506 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

In one or more examples, the computer-readable storage medium 506 may include software configured for various functions, including, for example, base graph selection and transport block size determination used in wireless communication. For example, the software may include the processing instructions 552, UL communication instructions 554, and DL communication instructions 556 that may configure the processor 504 to implement one or more of the functions described in relation to FIGS. 7-10.

Figure 6:
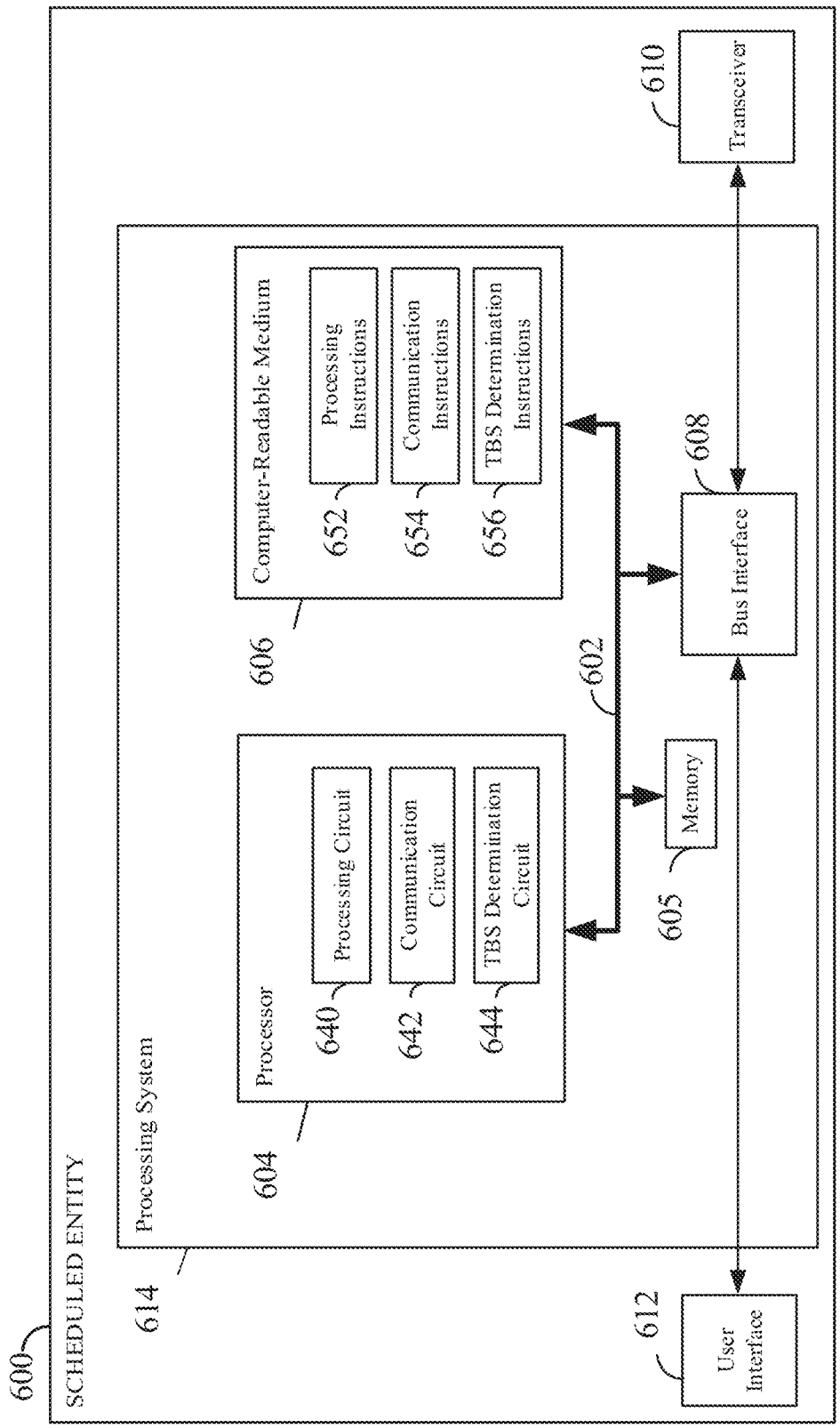
FIG. 6 is a block diagram conceptually illustrating an example of a hardware implementation for a scheduled entity according to some aspects of the disclosure.

FIG. 6 is a conceptual diagram illustrating an example of a hardware implementation for an exemplary scheduled entity 600 employing a processing system 614. In accordance with various aspects of the disclosure, an element, or any portion of an element, or any combination of elements may be implemented with a processing system 614 that includes one or more processors 604. For example, the scheduled entity 600 may be a user equipment (UE) as illustrated in any one or more of FIGS. 1, 2, and/or 3.

The processing system 614 may be substantially the same as the processing system 614 illustrated in FIG. 4, including a bus interface 608, a bus 602, memory 605, a processor 604, and a computer-readable medium 606. Furthermore, the scheduled entity 600 may include a user interface 612 and a transceiver 610 substantially similar to those described above in FIG. 4. That is, the processor 604, as utilized in a scheduled entity 600, may be used to implement any one or more of the processes and functions described below and illustrated in FIGS. 7-10.

In some aspects of the disclosure, the processor 604 may include circuitry configured for various functions, including, for example, base graph selection and transport block size determination used in wireless communication. For example, the circuitry may be configured to implement one or more of the functions described in relation to FIGS. 7-10. The processor 604 may include a processing circuit 640 that can be configured by processing instructions 622 to perform various data processing functions used in wireless communication. The processor 604 may include a communication circuit 642 that can be configured by communication instructions 654 to perform various functions used in UL and DL communication via the transceiver 610. The communication circuit 642 may configure the target code rate, and modulation and coding scheme used in wireless communication. The processor 604 may include a transport block size (TBS) determination circuit 644 that can be configured by TBS determination instructions 656 to perform various functions for selecting base graph and determining TBS used in wireless communication.

In the 5G NR standards, a transport block size (TBS) may be determined as a function of various parameters including $N_{RE}$, V, $Q_m$, and R. Here, $N_{RE}$ is the number of resource elements (REs) assigned to a transport block (TB), v is the number of multiple-input and multiple-output (MIMO) layers, $Q_m$ is the modulation order, and R is the code rate. However, some functions or procedures used for determining the TBS depend on cyclic dependencies between the TBS and the parameters (e.g., $N_{RE}$, v, $Q_m$, and/or R) used to determine the TBS. Such cyclic dependencies may require use of recursive algorithms and/or multiple passes of a certain formula or function in order to determine the TBS. Therefore, the processing time and/or power consumption of the TBS determination may be undesirably increased or lengthened.

Aspects of the present disclosure provide a procedure and a method that can determine a TBS using a formula, function, equation, or algorithm in a single pass avoiding cyclic dependencies between the TB S and the parameters used in the formula or function. Moreover, the determined TBS can facilitate byte-aligned code block sizes and require no padding in a transport block.

In a 5G NR example, a TB-level CRC ($L_{TB,CRC}$) may be 24 bits for TBs larger than a predetermined threshold (e.g., 512 bits). If a TB is segmented into 2 or more CBs after CB segmentation, a CB-level CRC may be applied to the CBs. $K_{cb}$ is the maximum code block size. For example, CRC bits may be attached to each code block individually. In this case, $L_{TB,\ CRC}$ may be 16 bits for TBs smaller than or equal to a predetermined threshold (e.g., 3824 bits), and CB-level CRC ($L_{CB-CRC}$) may be 24 bits.

In one aspect of the present disclosure, TBS may be determined using a single equation (1) below.

$$TBS = \left\lceil \frac{1}{8} \frac{L_{TB,CRC} + N_{RE} \cdot Q_m \cdot R \cdot v - X}{\left\lceil \frac{L_{TB,CRC} + N_{RE} \cdot Q_m \cdot R \cdot v - X}{K_{cb} - L_{CB,CRC}} \right\rceil} \right\rceil \quad (1)$$

$$8 \left\lceil \frac{L_{TB,CRC} + N_{RE} \cdot Q_m \cdot R \cdot v - X}{K_{cb} - L_{CB,CRC}} \right\rceil - L_{TB,CRC}$$

In equation (1), X is a rate back-off factor that has a value equal to or greater than zero. For example, X can be a predetermined constant (e.g., 0, 8, 16, or 24) or value dependent on $N_{RE} \cdot Q_m \cdot R \cdot v$ that may be equal to the intermediate number of information bits. Using the rate back-off factor X can prevent the determined TBS from exceeding a nominal code rate. In the equation (1), the brackets represent ceiling functions and the "8" operator signifies byte-alignment or sizing.

Figure 7:
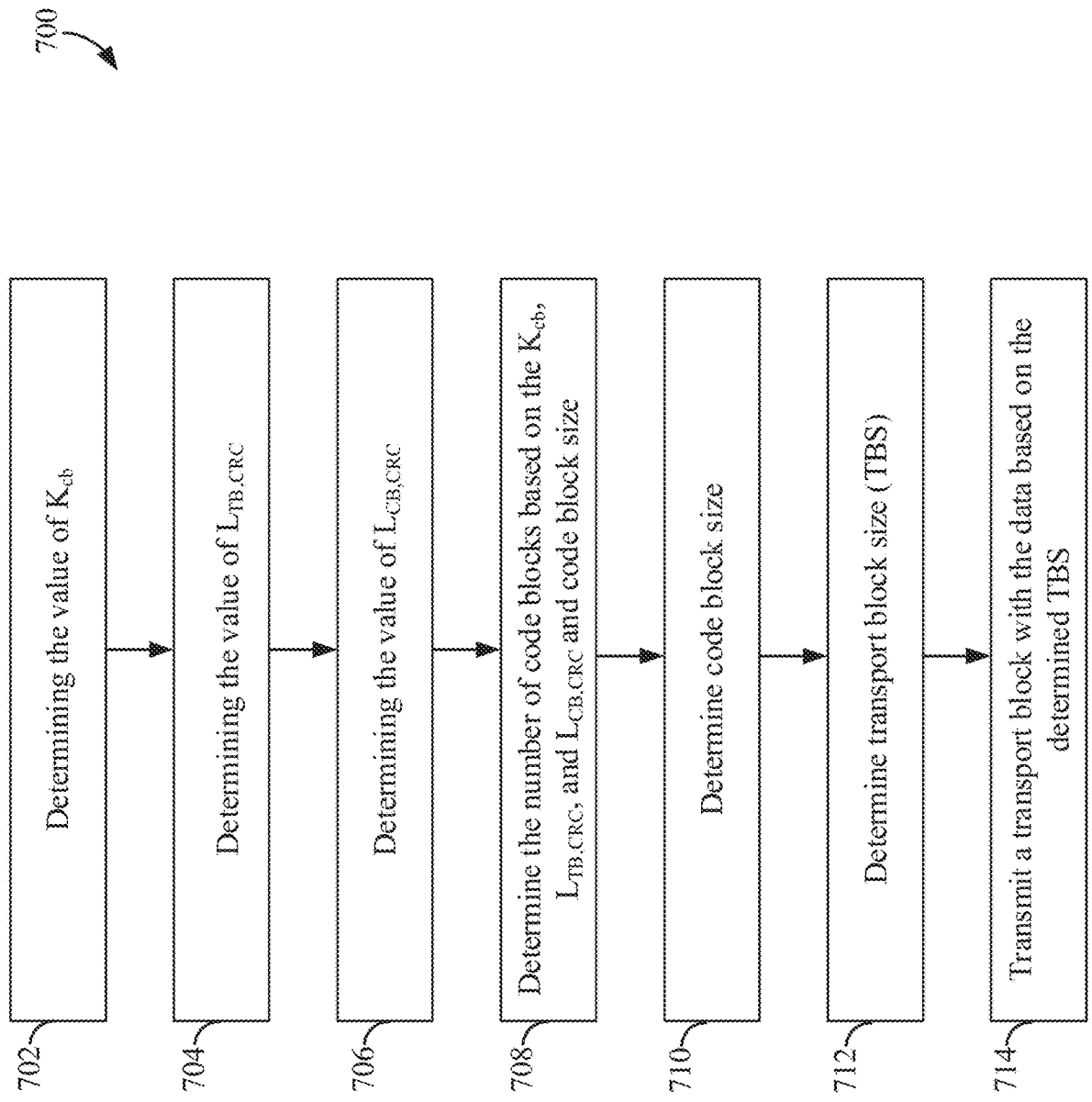
FIG. 7 is a flow chart illustrating an exemplary process for determining a transport block size (TBS) using an equation in a single pass according to some aspects of the present disclosure.

FIG. 7 is a flow chart illustrating an exemplary process 700 for determining a TBS in a single pass according to some aspects of the present disclosure. The TBS may be used for transmitting a transport block with data in a UL or DL transport channel. As described below, some or all illustrated features may be omitted in a particular implementation within the scope of the present disclosure, and some illustrated features may not be required for implementation of all embodiments. In some examples, the process 700 may be carried out by the scheduling entity 500 illustrated in FIG. 5 or the scheduled entity 600 (e.g., UE) illustrated in FIG. 6. In some examples, the process 700 may be carried out by any suitable apparatus or means for carrying out the functions or algorithm described below.

Figure 8:
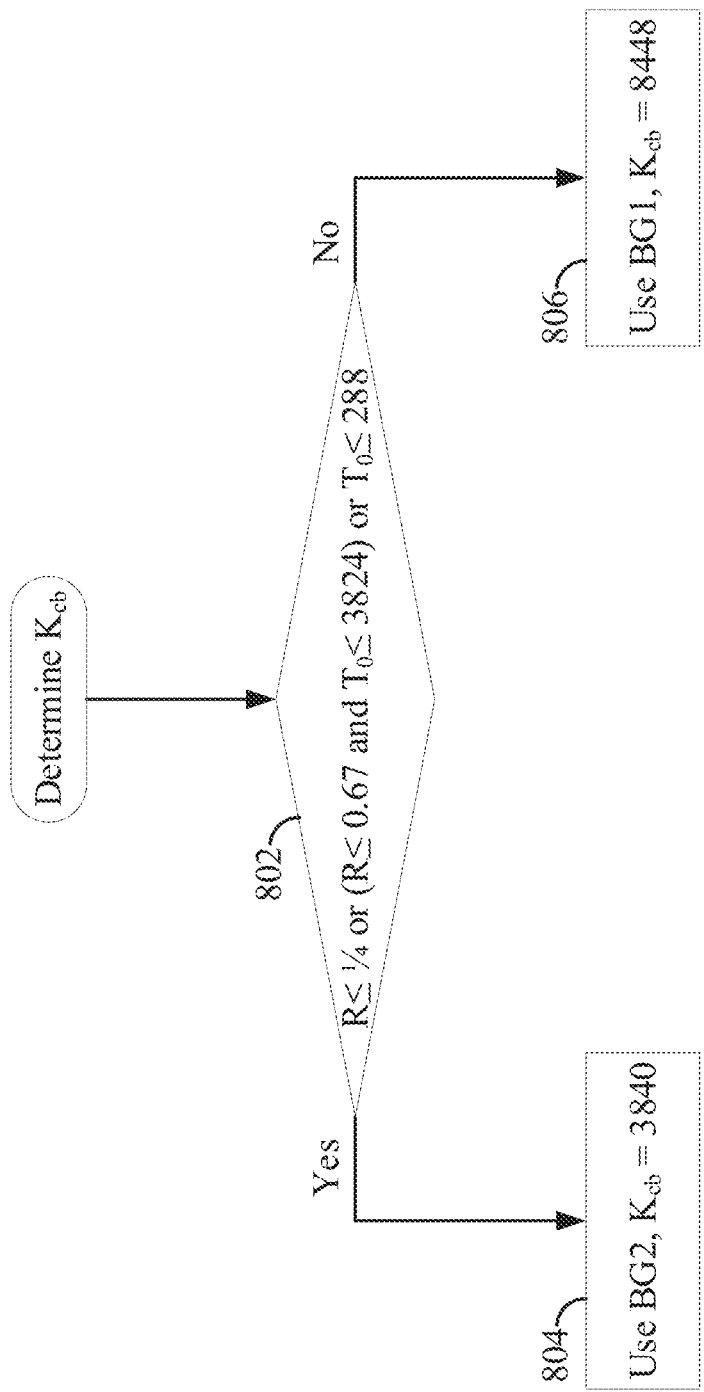
FIG. 8 is a flow chart illustrating an exemplary process for determining a maximum code block size according to some aspects of the present disclosure.

At block 702, a scheduled entity 600 (e.g., UE) can utilize TBS determination circuit 644 to determine the value of a maximum code block size ($K_{cb}$). First, the scheduled entity may determine an intermediate value $T_0 = N_{RE} \cdot Q_m \cdot R \cdot v - X$. Here, $N_{RE} \cdot Q_m \cdot R \cdot v$ may represent an intermediate number of information bits. The rate back-off factor X may be any value (e.g., 0, 8, 16, or 24) that prevents the determined TBS from exceeding a nominal code rate. As illustrated in FIG. 8, at decision block 802, if the condition (R≤1/4) or (R≤0.67 and $T_0$≤3824) or ($T_0$≤288) is true, at block 804, the TBS determination circuit 644 selects a first base graph (e.g., BG2) and sets $K_{cb}$ to a first value (e.g., 3840); otherwise, at block 806, the TBS determination circuit 644 selects a second base graph (e.g., BG1) and sets $K_{cb}$ to a second value (e.g., 8448) that is greater than the first value. In one example, the scheduled entity 600 may receive information (e.g., MCS, code rate, MIMO configuration, etc.) from a scheduling entity 500, to determine the $N_{RE}$, $Q_m$, R, and v.

Figure 9:
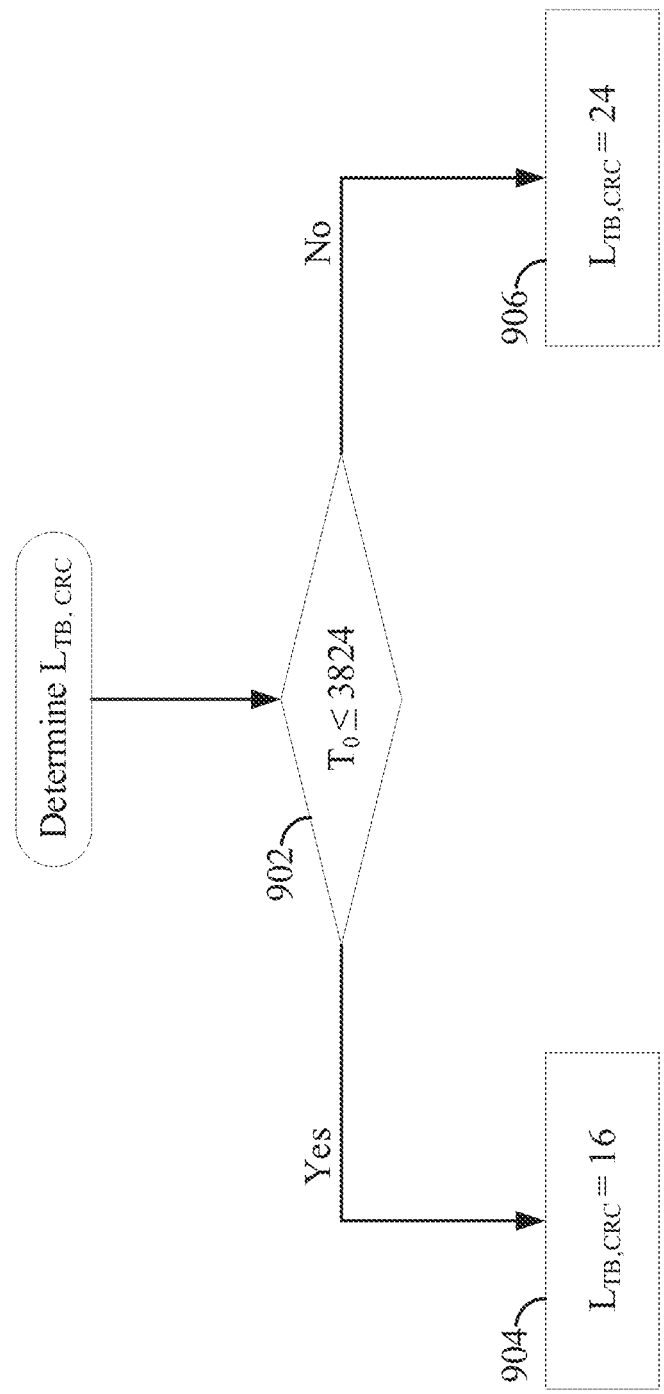
FIG. 9 is a flow chart illustrating an exemplary process for determining a cyclic redundancy check size for a transport block according to some aspects of the present disclosure.

At block 704, the scheduled entity 600 may utilize the TBS determination circuit 644 to determine a TB-level CRC size ($L_{TB,CRC}$) As illustrated in FIG. 9, at decision block 902, if the condition $T_0$≤3824 is true, at block 904, the TBS determination circuit 644 may set $L_{TB,CRC}$ to a first value (e.g., 16); otherwise, at block 906, the TBS determination circuit 644 may set $L_{TB,CRC}$ to a second value (e.g., 24) that is greater than the first value.

Figure 10:
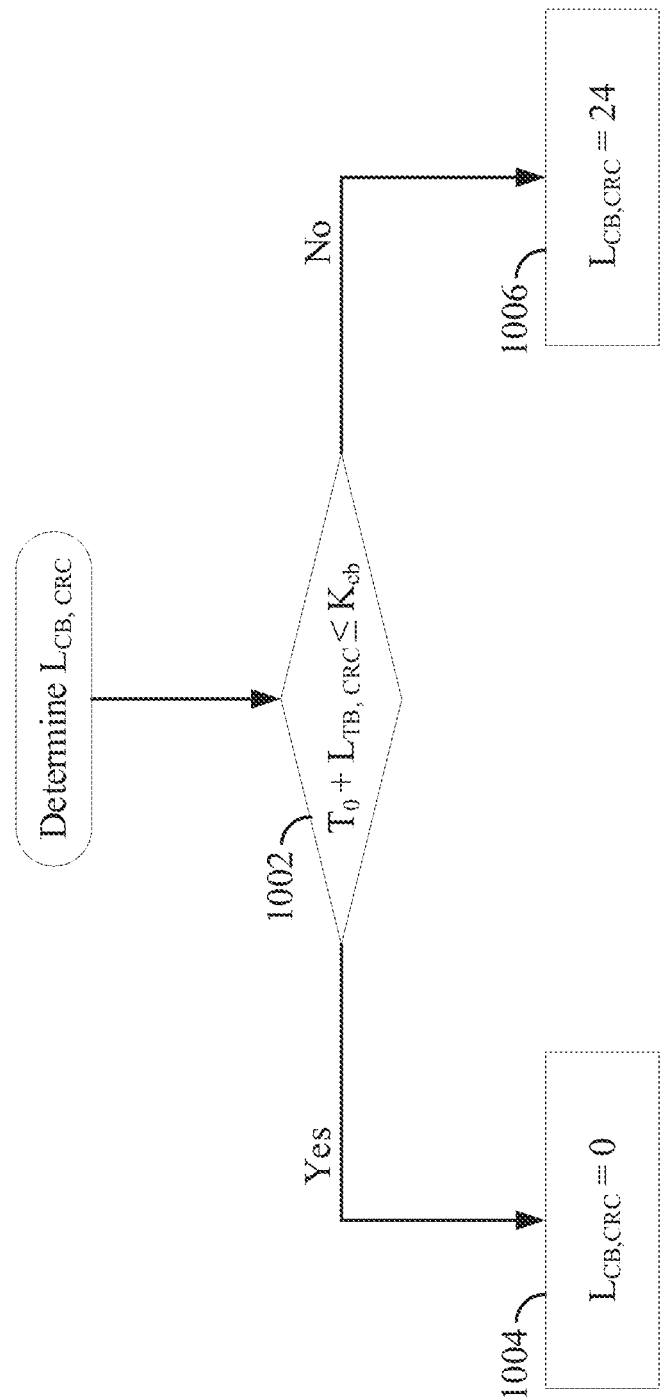
FIG. 10 is a flow chart illustrating an exemplary process for determining a cyclic redundancy check size for a code block according to some aspects of the present disclosure.

At block 706, the scheduled entity 600 may utilize the TBS determination circuit 644 to determine a CB CRC size ($L_{CB,CRC}$) As illustrated in FIG. 10, at decision block 1002, if the condition $T_0 + L_{TB,CRC} < K_{cb}$ is true then, at block 1004, the TBS determination circuit 644 sets $L_{CB,cRC}$ to a first value (e.g., 0); otherwise, at block 1006, the TBS determination circuit 644 sets $L_{CB,CRC}$ to a second value (e.g., 24) that is greater than the first value.

At block 708, the scheduled entity 600 may utilize the TBS determination circuit 644 to determine the number of code blocks (C) or information block length based on $T_0$, $K_{cb}$, $L_{TB,CRC}$, and $L_{CB,CRC}$, for example, using equation (2) set forth below.

$$C = \left\lceil \frac{T_0 + L_{TB,CRC}}{K_{cb} - L_{CB,CRC}} \right\rceil \quad (2)$$

At block 710, the scheduled entity 600 may utilize the TB S determination circuit 644 to determine the code block size (K), for example, using equation (3) set forth below. Using such code block size, the code blocks can be byte or 8-bit aligned.

$$K = \left\lceil \frac{1}{8} \frac{T_0 + L_{TB,CRC}}{C} \right\rceil 8 \quad (3)$$

At block 712, the scheduled entity 600 may utilize the TB S determination circuit 644 to determine the TBS using equation (4) set forth below.

$$TBS = K \cdot C \ L_{TB,CRC} \quad (4)$$

Equation (4) when expanded becomes the single TBS equation (1) as set forth above. At block 714, the scheduled entity 600 may utilize the communication circuit 642 and transceiver 610 to transmit a transport block (TB) with the data based on the determined TBS. Therefore, using the process 700, the scheduled entity 600 can use equation (1) or portions thereof in a single pass or a non-recursive manner to determine a TBS that provides byte-aligned code block lengths and requires no padding. Single-pass means that the process as described above can determine the TBS without dealing with the cyclic dependencies between the TBS, base graph (e.g., BG1 or BG2), and code block size. That is, the values of the different parameters of equation (1) are determined once, and the TBS can be calculated using equation (1) without changing the parameters based on the determined value of the TBS.

In this example, the term $$\frac{1}{K_{cb} - L_{CB,CRC}}$$

can take one of four values because the parameters $K_{cb}$ and $L_{CB,CRC}$ each have two predetermined values as described above. For example, $K_{cb}$ may be 3840 or 8448, and $L_{CB,CRC}$ may be 16 or 24. In some aspects of the disclosure, the four values can be stored in a look-up table to avoid numerical issues or calculations.

Similarly, the term $$\frac{1}{C} = \frac{1}{\left\lceil \frac{L_{TB,CRC} + N_{RE} \cdot Q_m \cdot R \cdot v - X}{K_{cb} - L_{CB,CRC}} \right\rceil}$$

can take one of a limited set of values (i.e., the number of code blocks is limited to integers with a maximum value<=200). In some aspects of the disclosure, these values can be stored in a look-up table to avoid numerical issues or calculations. In one aspect of the disclosure, the TBS and intermediate values can be stored in lookup tables, where the look-up is based on which range $N_{RE} \cdot Q_m \cdot R \cdot v$ falls in, as well as the selected base graph.

In one configuration, the apparatus (e.g., scheduled entity 600) for wireless communication includes means for determining a maximum code block size ($K_{cb}$) of a transport block (TB); means for determining a transport block level cyclic redundancy check size ($L_{TB,CRC}$); means for determining a code block level cyclic redundancy check size ($L_{CB,CRC}$); means for determining a number of code blocks associated with the TB based on the $K_{cb}$, $L_{TB,CRC}$, and $L_{CB,CRC}$; means for determining a code block size based on the number of code blocks; and means for determining a transport block size (TB S) of the TB in a single pass as a function of the determined $K_{cb}$, $L_{TB,CRC}$, $L_{CB,CRC}$, number of code blocks, and code block size; and means for transmitting the TB with data based on the determined TBS. In some aspects of the disclosure, the various means above may be implemented using the TBS determination circuit 644, the TBS determination instructions 656, the transceiver 610, the computer readable medium 606, and other elements described herein to implement the processes illustrated in FIGS. 7-10.

In one aspect, the aforementioned means may be the processor 604 shown in FIG. 6 configured to perform the functions recited by the aforementioned means. In another aspect, the aforementioned means may be a circuit or any apparatus configured to perform the functions recited by the aforementioned means.

Of course, in the above examples, the circuitry included in the processor 604 is merely provided as an example, and other means for carrying out the described functions may be included within various aspects of the present disclosure, including but not limited to the instructions stored in the computer-readable storage medium 606, or any other suitable apparatus or means described in any one of the FIGS. 1,2, and/or 3, and utilizing, for example, the processes and/or algorithms described herein in relation to FIGS. 7-10.

Several aspects of a wireless communication network have been presented with reference to an exemplary implementation. As those skilled in the art will readily appreciate, various aspects described throughout this disclosure may be extended to other telecommunication systems, network architectures and communication standards.

By way of example, various aspects may be implemented within other systems defined by 3GPP, such as Long-Term Evolution (LTE), the Evolved Packet System (EPS), the Universal Mobile Telecommunication System (UMTS), and/or the Global System for Mobile (GSM). Various aspects may also be extended to systems defined by the 3rd Generation Partnership Project 2 (3GPP2), such as CDMA2000 and/or Evolution-Data Optimized (EV-DO). Other examples may be implemented within systems employing IEEE 802.11 (Wi-Fi), IEEE 802.16 (WiMAX), IEEE 802.20, Ultra-Wideband (UWB), Bluetooth, and/or other suitable systems. The actual telecommunication standard, network architecture, and/or communication standard employed will depend on the specific application and the overall design constraints imposed on the system.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in FIGS. 1-10 may be rearranged and/or combined into a single component, step, feature or function or embodied in several components, steps, or functions. Additional elements, components, steps, and/or functions may also be added without departing from novel features disclosed herein. The apparatus, devices, and/or components illustrated in FIGS. 1-10 may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A method of transmitting data in a transport block (TB) in wireless communication, comprising:
    determining an intermediate value based on a number of resource elements, a modulation order, a code rate, and a number of MIMO layers for transmitting the TB;
    selecting a maximum code block size from a plurality of maximum code block sizes;
    determining a number of code blocks associated with the TB based on the intermediate value and the selected maximum code block size;
    determining a code block size based on the number of code blocks;
    determining a transport block size (TBS) for the TB as a function of the code block size, the number of code blocks, and a rate back-off factor; and
    transmitting the TB using the determined TBS,
    wherein the rate back-off factor has a value dependent at least on Qm, R, and v, where Qm is a modulation order, R is a code rate, and v is a number of multiple-input multiple-output MIMO layers.

2. The method of claim 1, wherein the determining the code block size comprises determining a code block (CB) level cyclic redundancy check (CRC) size by selecting the CB level CRC size from a plurality of predetermined CRC sizes based on the intermediate value.

3. The method of claim 2, wherein the determining the code block size further comprises determining a byte-aligned code block size.

4. The method of claim 1, wherein the determining the TBS further comprises determining a TB level cyclic redundancy check (CRC) size by selecting the TB level CRC size from a plurality of predetermined CRC sizes based on the intermediate value.

5. The method of claim 1, wherein the determining the TBS further comprises determining the TBS without cyclic dependencies between the TBS, a selected base graph, and the code block size.

6. The method of claim 5, further comprising:
    selecting the base graph based on at least one of the code rate or the intermediate value; and
    determining the maximum code block size based on the selected base graph.

7. The method of claim 1, wherein the transmitting the TB comprises transmitting the TB with no padding bits.

8. The method of claim 1, wherein the determining the TBS comprises:
    determining the TBS using a non-recursive function of the code block size and the number of code blocks.

9. An apparatus of wireless communication, comprising:
    a communication interface configured to transmit data in a transport block (TB);
    a memory; and
    a processor coupled with the communication interface and the memory,
    wherein the processor and the memory are configured to:
        determine an intermediate value based on a number of resource elements, a modulation order, a code rate, and a number of MIMO layers for transmitting the TB;
        select a maximum code block size from a plurality of maximum code block sizes;
        determine a number of code blocks associated with the TB based on the intermediate value;
        determine a code block size based on the number of code blocks;
        determine a transport block size (TBS) for the TB as a function of the code block size, the number of code blocks, and a rate back-off factor; and
        transmit the TB using the determined TBS,
    wherein the rate back-off factor has a value dependent at least on Qm, R, and v, where Qm is a modulation order, R is a code rate, and v is a number of multiple-input multiple-output MIMO layers.

10. The apparatus of claim 9, wherein, to determine the code block size, the processor and the memory are further configured to:
    determine a code block (CB) level cyclic redundancy check (CRC) size by selecting the CB level CRC size from a plurality of predetermined CRC sizes based on the intermediate value.

11. The apparatus of claim 10, wherein, to determine the code block size, the processor and the memory are further configured to:
    determine a byte-aligned code block size.

12. The apparatus of claim 9, wherein, to determine the TBS, the processor and the memory are further configured to:
    determine a TB level cyclic redundancy check (CRC) size by selecting the TB level CRC size from a plurality of predetermined CRC sizes based on the intermediate value.

13. The apparatus of claim 9, wherein, to determine the TBS, the processor and the memory are further configured to:
    determine the TBS without cyclic dependencies between the TBS, a selected base graph, and the code block size.

14. The apparatus of claim 13, wherein the processor and the memory are further configured to:
    select the base graph based on at least one of the code rate or the intermediate value; and
    determine the maximum code block size based on the selected base graph.

15. The apparatus of claim 9, wherein, to transmit the TB, the processor and the memory are further configured to:
    transmit the TB with no padding bits.

16. The apparatus of claim 9, wherein, to determine the TBS, the processor and the memory are further configured to:
    determine the TBS as a non-recursive function of the code block size and the number of code blocks.

17. An apparatus of wireless communication, comprising:
    means for determining an intermediate value based on a number of resource elements, a modulation order, a code rate, and a number of MIMO layers for transmitting a transport block (TB);
    means for selecting a maximum code block size from a plurality of maximum code block sizes;

means for determining a number of code blocks associated with the TB based on the intermediate value and the selected maximum code block size;
means for determining a code block size based on the number of code blocks;
means for determining a transport block size (TBS) for the TB as a function of the code block size, the number of code blocks, and a rate back-off factor; and
means for transmitting the TB using the determined TBS, wherein the rate back-off factor has a value dependent at least on Qm, R, and v, where Qm is a modulation order, R is a code rate, and v is a number of multiple-input multiple-output MIMO layers.

18. A non-transitory computer-readable medium comprising executable code stored thereon which, when executed by a processor, causes an apparatus for wireless communication to:
determine an intermediate value based on a number of resource elements, a modulation order, a code rate, and a number of MIMO layers for transmitting a transport block (TB);
selecting a maximum code block size from a plurality of maximum code block sizes;
determine a number of code blocks associated with the TB based on the intermediate value and the selected maximum code block size;
determine a code block size based on the number of code blocks;
determine a transport block size (TBS) for the TB as a function of the code block size, the number of code blocks, and a rate back-off factor; and
transmit the TB using the determined TBS,
wherein the rate back-off factor has a value dependent at least on Qm, R, and v, where Qm is a modulation order, R is a code rate, and v is a number of multiple-input multiple-output MIMO layers.

* * * * *